(12) United States Patent
Kim et al.

(10) Patent No.: US 7,531,247 B2
(45) Date of Patent: *May 12, 2009

(54) ORGANIC ELECTROLUMINESCENT DEVICE

(75) Inventors: Myung Seop Kim, Seoul (KR); Hyoung Yun Oh, Seoul (KR); Jae Man Lee, Seoul (KR); Sung Gap Kim, Anyang-si (KR); Jong Geun Yoon, Anyang-si (KR); Seong Joong Kim, Seoul (KR); Hong Gyu Kim, Uiwang-si (KR); Joong Hwan Yang, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 404 days.

This patent is subject to a terminal disclaimer.

(21) Appl. No.: 11/140,736

(22) Filed: Jun. 1, 2005

(65) Prior Publication Data
US 2005/0271898 A1 Dec. 8, 2005

(30) Foreign Application Priority Data
Jun. 3, 2004 (KR) ...................... 10-2004-0040425

(51) Int. Cl.
H01L 35/24 (2006.01)
C09K 11/08 (2006.01)

(52) U.S. Cl. .................. 428/690; 428/917; 313/504; 313/506; 257/40; 257/88; 257/89; 257/90; 257/100; 257/102; 257/103; 252/301.16; 252/301.35

(58) Field of Classification Search .................. 428/690, 428/917; 427/58, 66; 313/502–509; 257/40, 257/88–103, E51.001–E51.052, 80; 252/301.16–301.35
See application file for complete search history.

(56) References Cited

U.S. PATENT DOCUMENTS

| 5,783,292 | A * | 7/1998 | Tokito et al. ................. 428/212 |
| 6,566,807 | B1 * | 5/2003 | Fujita et al. ................. 313/506 |
| 6,841,932 | B2 * | 1/2005 | Aziz et al. ................... 313/503 |
| 6,876,144 | B2 * | 4/2005 | Peng ........................... 313/504 |
| 7,297,417 | B2 * | 11/2007 | Kim et al. .................... 428/690 |
| 2002/0086180 | A1 * | 7/2002 | Seo et al. ..................... 428/690 |

FOREIGN PATENT DOCUMENTS

| CN | 1427654 | 7/2003 |
| CN | 1447629 | 10/2003 |
| JP | 11-026167 | 1/1999 |
| JP | 2001-244079 | 9/2001 |

* cited by examiner

Primary Examiner—D. Lawrence Tarazano
Assistant Examiner—Camie S Thompson
(74) Attorney, Agent, or Firm—Holland & Knight LLP (57) ABSTRACT

An organic electroluminescence (EL) device capable of digital driving, and a method for manufacturing the same are disclosed herein. The organic EL device comprises a substrate, an anode formed on the substrate, an organic EL layer formed on the anode and constructed as a multilayer structure including a hole injection layer and a hole transport layer, a cathode formed on the organic EL layer, and an interface deterioration preventing layer formed between the anode and the organic EL layer.

16 Claims, 8 Drawing Sheets

ORGANIC ELECTROLUMINESCENT DEVICE

This application claims the benefit of Korean Patent Application No. 10-2004-0040425, filed on, Jun. 3, 2004, which is hereby incorporated by reference as if fully set forth herein.

BACKGROUND OF THE INVENTION

1. Field of the Invention

The present invention relates to an organic electroluminescent device, and more particularly, to an organic electroluminescent device capable of digital driving, and a method for manufacturing the same.

2. Discussion of the Related Art

Generally, an organic electroluminescent device (referred to hereinafter simply as an "organic EL device") is operated in such a manner that, when electric charges are injected into an organic film formed between an electron injection electrode (anode) and a hole injection electrode (cathode), electrons and holes are recombined and then extinguished, thereby generating light. Such an organic EL device has been evaluated as a next generation display device having characteristics of low driving voltage and low power consumption.

Construction of a conventional organic EL device and a method for manufacturing the same will be described with reference to the accompanying drawings.

Figure 1:
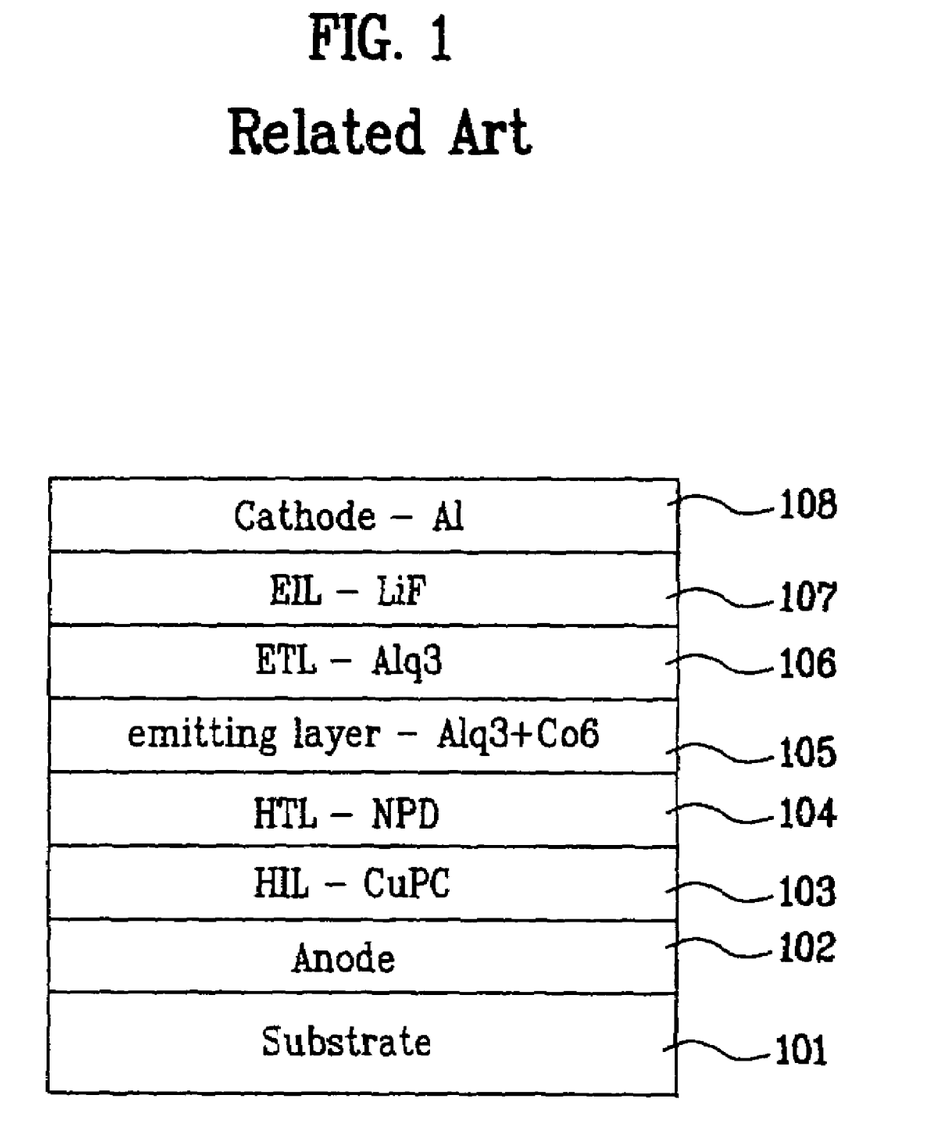
FIG. 1 illustrates a conventional organic EL device.

FIG. 1 illustrates a conventional organic EL device.

As shown in FIG. 1, the organic EL device has an anode 102 formed on a transparent substrate 101. A material for the anode 102 generally comprises indium tin oxide (ITO), and the anode 102 is surface-treated using $O_2$ plasma, UVO, and the like after the substrate 101 is coated with ITO. When impurities on the surface of the anode 102 are removed by surface treatment as described above, interface properties between the anode and a hole injection layer are enhanced, thereby allowing easy injection of holes.

Then, the hole injection layer (which will also be referred to "HIL") 103 is formed on the anode 102. As for the HIL 103, copper phthalocyanine (CuPc) is generally coated to a thickness of about 10~30 nm on the anode 102.

A hole transport layer (HTL) 104 is formed on the HIL 103. As the HLT 104, N,N'-diphenyl-N,N'-bis(3-methylphenyl)-(1,1'biphenylyl)-4,4'-diamine (TPD) or 4,4'-bis[N-(1-naphthyl)-N-phenyl-amino]biphenyl (NPD) is formed to a thickness of about 30~60 nm on the HIL 103.

An organic emitting layer 105 is formed on the HTL 104. At this time, dopants can be added, if necessary. In the case of a green light emitting device, tris(8-hydroxy-quinolate)aluminum (Alq3) as the organic emitting layer 105 is typically deposited to a thickness of about 30~60 nm, and coumine derivative (C545T) or quinacridone (Qd) so the dopant is used. In the case of a red light emitting device, Alq3 is used as the organic emitting layer 105, and DCM, DCJT, DCJTB or the like is used as the dopant. In the case of a blue light emitting device, DPVBi is generally used as the organic emitting layer 105 without any dopant.

An electron transport layer (which will also be referred to as "ETL") 106, and an electron injecting layer (which will also be referred to as "EIL") 107 are sequentially formed on the organic emitting layer 105. In the case of the green light emitting device, since Alq3 has good electron transportation capabilities, it is not necessary to form the ETL 106 and the EIL 107 thereon.

For the electron injecting layer 107, LiF or $Li_2O$ is thinly deposited to a thickness of about 5 Å, otherwise alkali metal or alkaline earth metal such as Li, Ca, Mg, Sm and the like is deposited to a thickness of about 200 □, thereby allowing easy injection of electrons.

For a cathode 108, Al is coated to a thickness of about 1,000 Å on the electron injecting layer 107, and a closing plate (not shown) containing a hygroscopic agent is bonded to the cathode 108 using an ultraviolet curable bonding agent thereby protecting the organic EL device from moisture or $O_2$ in the atmosphere.

The organic EL device constructed as described above may suffer great changes in life span and efficiency according to materials, surface treatment conditions for the anode, and stacked structures of the organic EL device.

Generally, it is important for the organic EL device to have an extended life span and a stabilized interface between the layers for stable current injection.

However, in the organic EL device, the interfaces between inorganic layers and organic layers cause a deterioration of the device.

In the organic EL device, the interfaces between the inorganic layers and the organic layers include an interface between the anode and the hole injection layer, and an interface between the electron transport layer and the electron injecting layer (or the cathode). Especially, the interface between the anode and the hole injection layer is the most influential upon deterioration of the device.

Thus, according to the prior art, in order to solve this problem, the HIL is deposited on the anode after the anode formed of ITO is surface-treated using $O_2$ plasma or UVO such that the impurities are removed from the surface of the anode 102.

As a result, the anode is enhanced in adhesion to the hole injection layer, so that life span of the device is extended, and current is stably injected therefrom.

However, with such a method, there is a limitation in extending the life span of the device.

Figure 2:
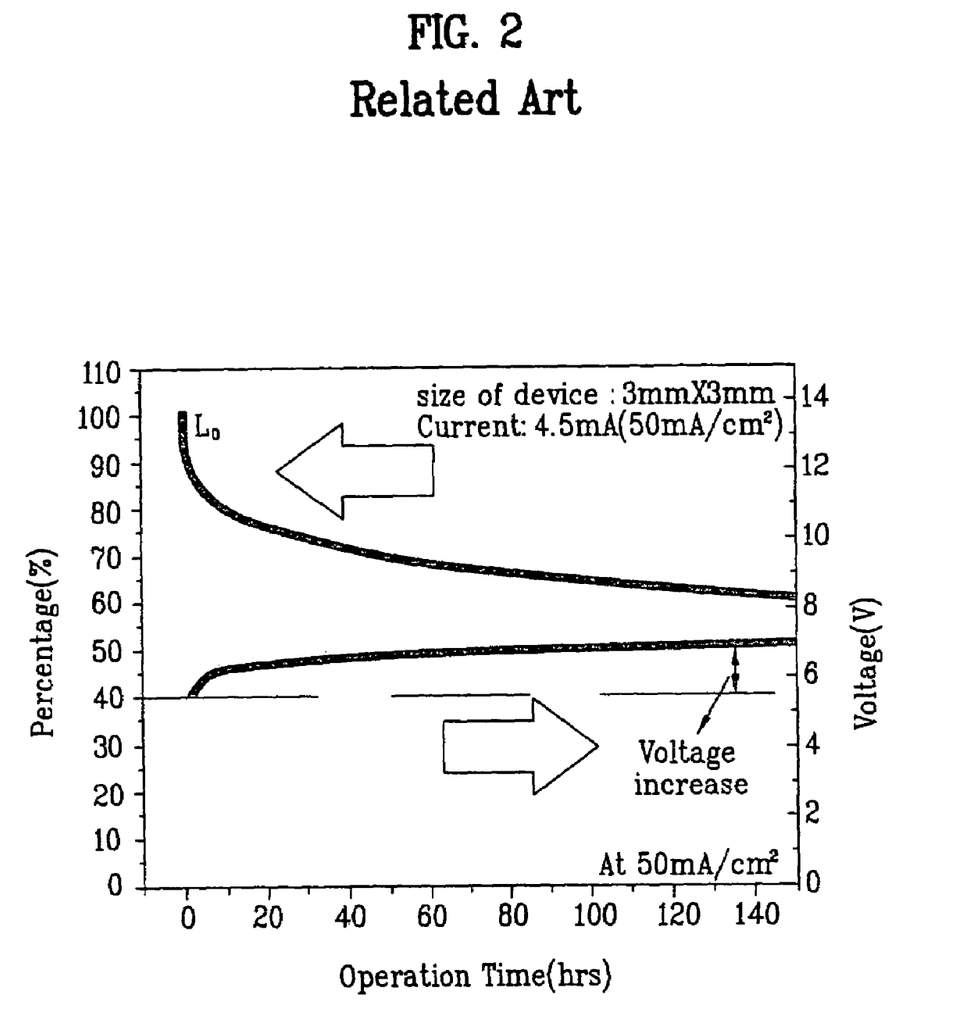
FIG. 2 is a graph depicting results of a test of constant current acceleration for a conventional green light emitting device.
Figure 3:
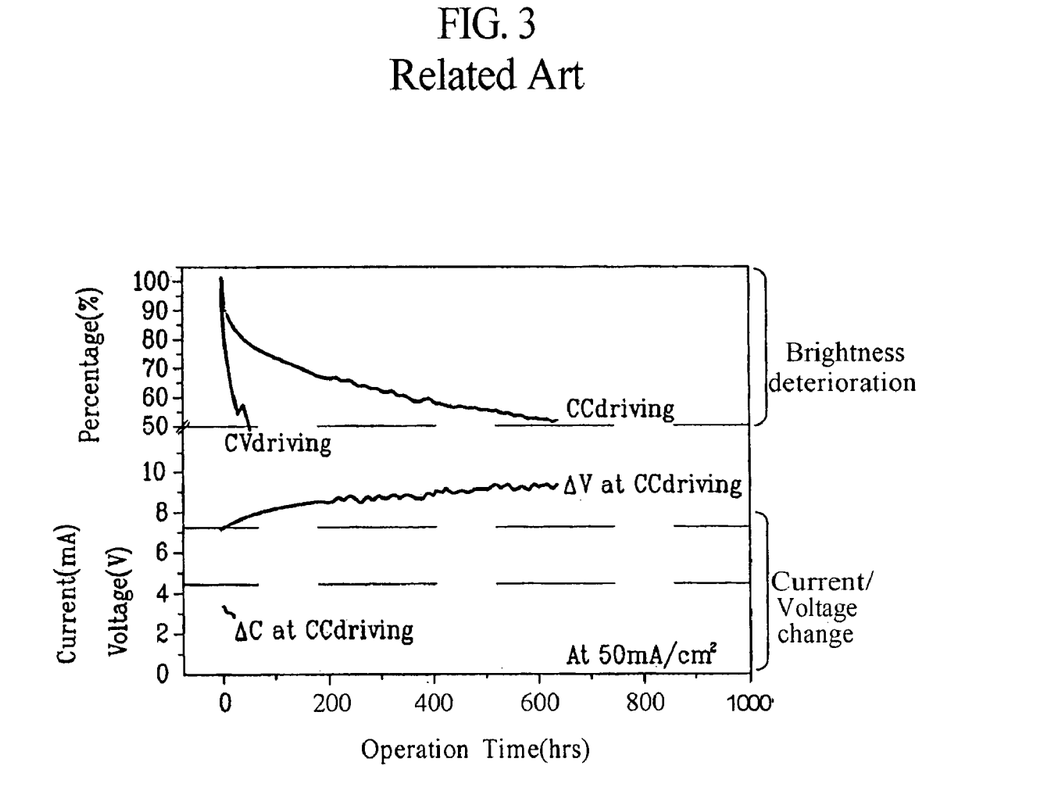
FIG. 3 is a graph depicting results of a test of constant voltage acceleration for the conventional green light emitting device.

FIG. 2 is a graph depicting results of a test of constant current acceleration for a green light emitting device having a surface treated anode, and FIG. 3 is a graph depicting results of a test of constant voltage acceleration for the green light emitting device having the surface treated anode.

As shown in FIG. 2, when the green light emitting device is driven in a constant current mode, a voltage applied to the device is increased. As a result, the device suffers reduction in brightness of 50% compared to an initial brightness. For the green light emitting device, the voltage is increased by approximately 2 V.

Additionally, as shown in FIG. 3, when the green light emitting device is driven in a constant voltage mode, current applied to the device is increased along with deterioration of the device. As a result, the brightness of the green light emitting device is sharply decreased 10 times of less of the brightness of the case where the device is driven in the constant current mode.

As such, in the organic EL device, the voltage increase upon constant current driving and the current decrease upon constant voltage driving are mostly caused by deterioration in the interfaces between the organic materials and the inorganic materials rather than deterioration of the organic material itself. In particular, among the interfaces between the organic materials and the inorganic materials, the interface between the anode formed of the organic material and the hole injection layer is the most influential upon deterioration of the device.

SUMMARY OF THE INVENTION

Accordingly, the present invention is directed to an organic electroluminescent device that substantially obviates one or more problems due to limitation and disadvantages of the related art.

An object of the present invention is to provide an organic electroluminescent device, which reduces deterioration created in an interface between an anode and an organic EL layer, thereby ensuring implementation of digital driving, extended life span, stabilized light emitting characteristics and minimized increase of voltage, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescence (EL) device comprises: a substrate; an anode formed on the substrate; an organic EL layer formed on the anode and constructed as a multilayer structure comprising a hole injection layer and a hole transport layer; a cathode formed on the organic EL layer; and an interface deterioration preventing layer formed between the anode and the organic EL layer.

The interface deterioration preventing layer may be formed either between the anode and the hole injection layer or between the anode and the hole transport layer.

The interface deterioration preventing layer may consist of a mixture of an organic material and an inorganic material, and the organic material may be an aromatic amine compound having hole transmission properties.

The aromatic amine compound may have a chemical structure of either

In the chemical structure, n may be an integer selected from 1 to 4, and $Ar_1$, $Ar_2$ and $Ar_3$ may be either substituted or non-substituted aromatic groups, respectively.

$Ar_1$, $Ar_2$ and $Ar_3$ may be ones selected from the group consisting of phenyl, naphthyl, biphenylyl, biphenylylenyl, phenanthrenyl, fluorenyl, terphenylyl and anthracenyl, and a substituent may be one selected from methyl, ethyl, propyl, t-buthyl, methoxy, ethoxy, propoxy, dimethylamine, diethylamine, phenyl, fluorine, chlorine, and bromine.

The inorganic material may be one selected from a halide or an oxide of 1A, 2A, 3A and 4A-groups of the periodic table. The halide may be one selected from LiF, NaF, KF, RbF, CsF, FrF, $MgF_2$, $CaF_2$, NaCl, $CaCl_2$, LiCl, KCl, RbCl, CsCl, FrCl, $MgCl_2$. The oxide may be one selected from $Li_2O$, $Na_2O$, $K_2O$, BeO, MgO, CaO, $B_2O_3$, $Al_2O_3$ and $SiO_2$.

In another aspect of the present invention, a method for manufacturing an organic electroluminescence (EL) device comprises the steps of: forming an anode on a substrate; forming an interface deterioration preventing layer consisting of a mixture of an organic material and an inorganic material on the anode; forming an organic EL layer comprising a hole injection layer on the interface deterioration preventing layer; and forming a cathode on the organic EL layer.

The interface deterioration preventing layer may be formed by repetitiously stacking organic and inorganic layers in the sequence of either organic layer/inorganic layer or inorganic layer/organic layer.

Each organic layer and inorganic layer may have a thickness of 0.1~10 nm, and the interface deterioration preventing layer may have a total thickness of 0.1~100 nm.

The interface deterioration preventing layer may be formed by depositing the organic material and the inorganic material at the same time such that the organic material is mixed with the inorganic material. Alternatively, the interface deterioration preventing layer may be formed by stacking the organic and inorganic layers in the sequence of either organic layer/inorganic layer or inorganic layer/organic layer such that a mixing ratio of the organic material and the inorganic material is linearly changed at an interface between the organic layer and the inorganic layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

According to the invention, an organic EL device has an interface deterioration preventing layer consisting of a mixture of an organic material and an inorganic material formed between an anode comprising ITO as the organic material and a hole injection layer consisting of the inorganic material, so that deterioration and thermal stress of the device is relieved, and so that the device is suppressed in voltage increase upon constant current driving while minimizing current decrease upon constant voltage driving.

Additionally, according to the present invention, an amount of holes injected into the organic EL device can be controlled, and a balance of electric charge between the holes and electrons can be optimized by controlling an amount of the inorganic material added to the interface deterioration preventing layer and a thickness of the interface deterioration preventing layer, thereby maximizing light efficiency of the device.

Figure 4:
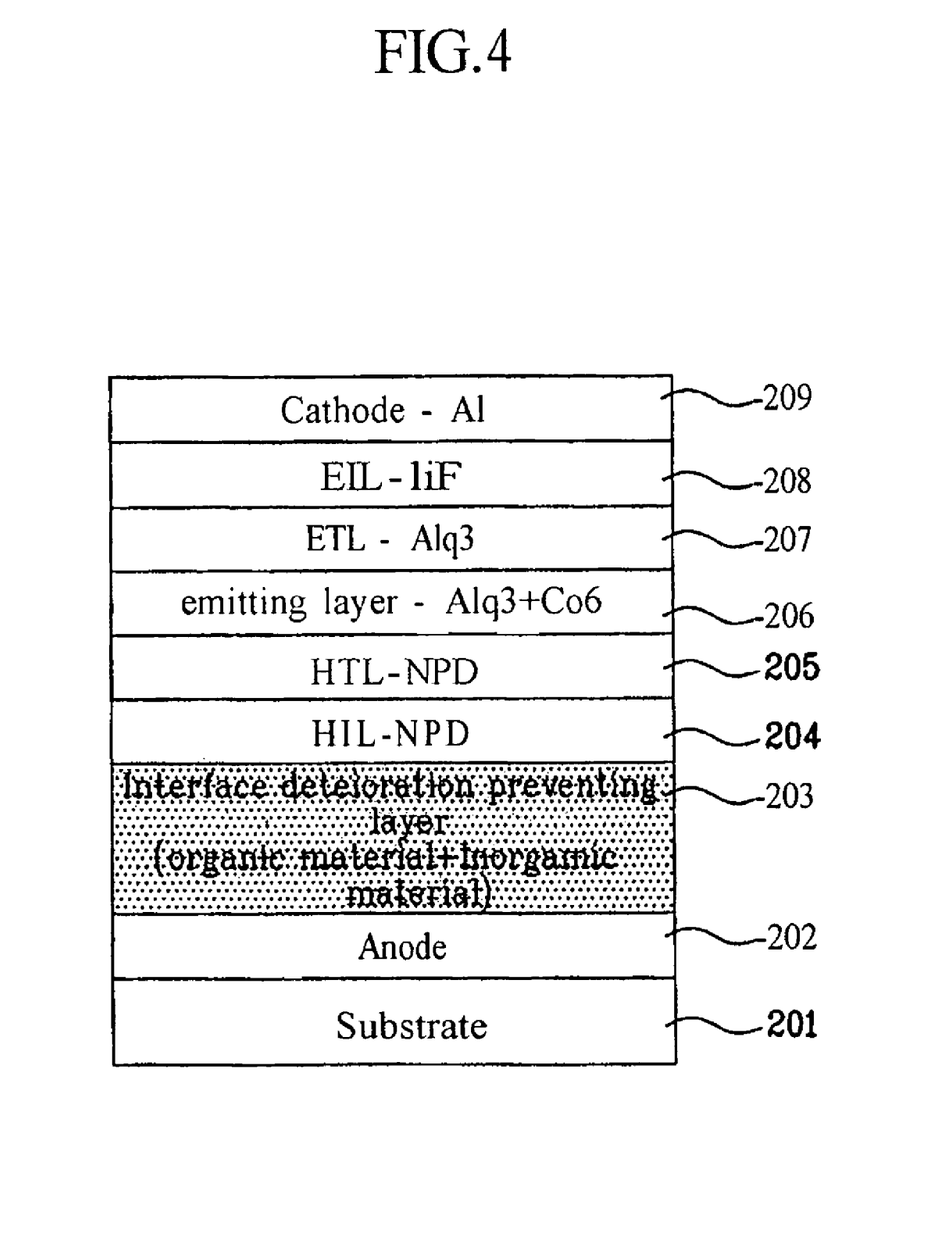
FIG. 4 illustrates an organic EL device in accordance with the present invention.
Figure 5:
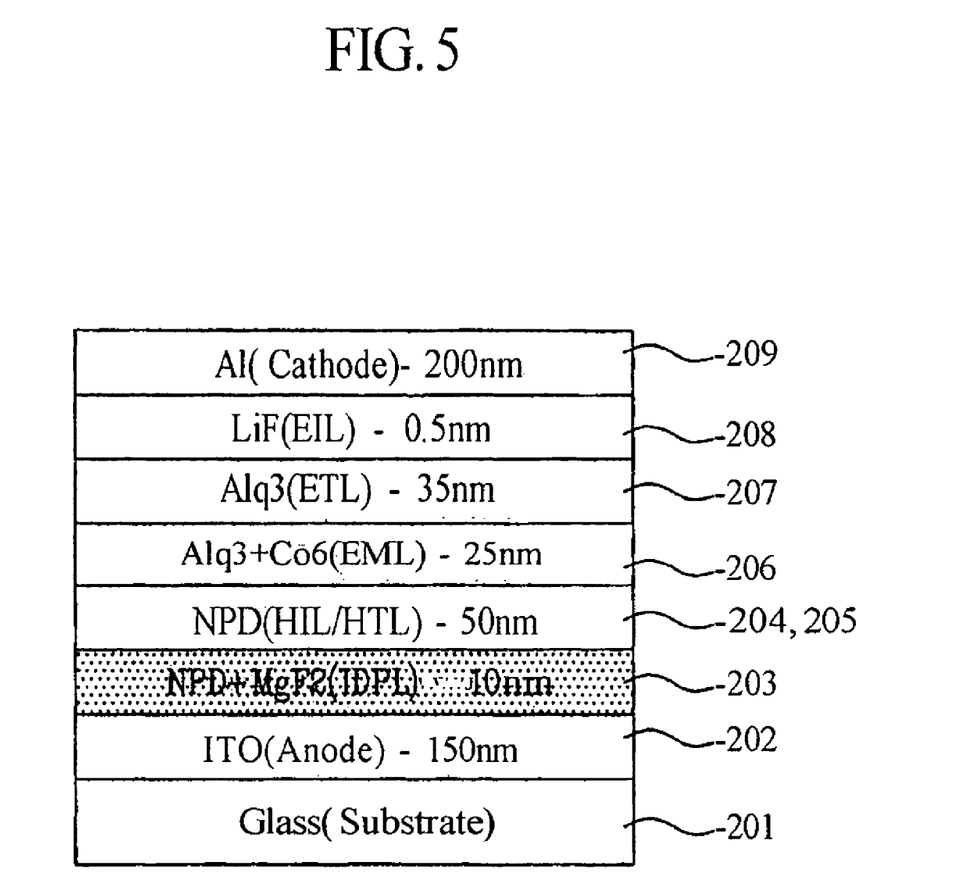
FIG. 5 illustrates one example of the organic EL device shown in FIG. 4.

FIG. 4 illustrates an organic EL device in accordance with the invention, and FIG. 5 illustrates one inventive example of the organic EL device of FIG. 4.

As shown in FIGS. 4 and 5, an anode 202 is formed on a transparent substrate 201.

The anode 202 comprises indium tin oxide (ITO)

Surface treatment is performed on the anode 202 formed on the transparent substrate 201 using $O_2$ plasma, UVO and the like in order to remove impurities from the surface of the anode 202.

When the impurities are removed from the surface of the anode 202, properties of an interface between the anode 202 and a hole injection layer described below are enhanced, thereby allowing easy injection of holes.

Then, an interface deterioration preventing layer (IDPL) 203 is formed on the anode 202.

Here, the interface deterioration preventing layer 203 consists of two components, that is, an organic material and an inorganic material.

The organic material can be one selected from aromatic amine compounds having hole transmission properties.

The aromatic amine compounds have a chemical structure of either

In the chemical structure, n is an integer selected from 1 to 4, and $Ar_1$, $Ar_2$ and $Ar_3$ are either substituted or non-substituted aromatic groups, respectively.

Examples of $Ar_1$, $Ar_2$ and $Ar_3$ include phenyl, naphthyl, biphenylyl, biphenylylenyl, phenanthrenyl, fluorenyl, terphenylyl and anthracenyl, and when the substituted aromatic groups are used, a substituent may be one selected from methyl, ethyl, propyl, t-buthyl, methoxy, ethoxy, propoxy, dimethylamine, diethylamine, phenyl fluorine, chlorine, bromine, and the like.

Figure 6:
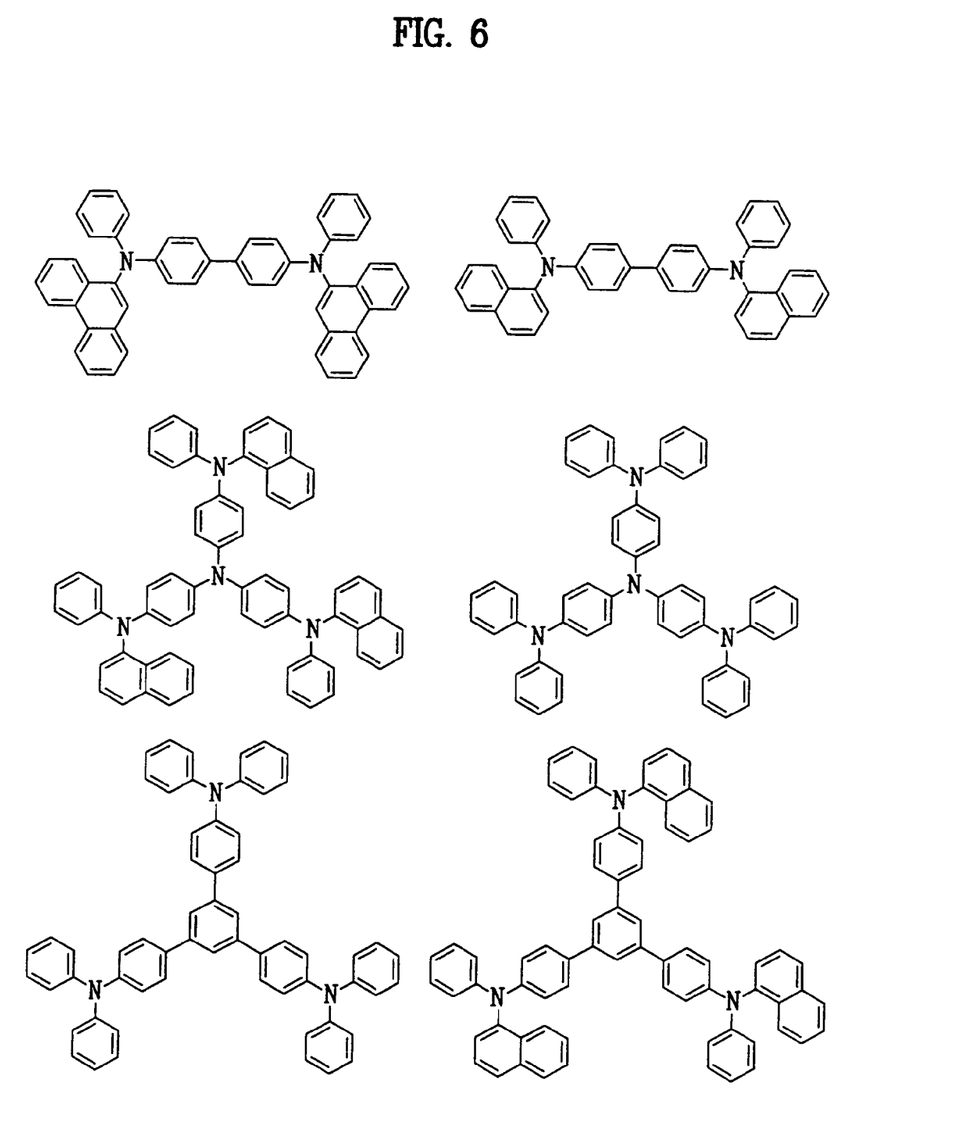
FIG. 6 illustrates organic material for an interface deterioration preventing layer of the organic EL device in accordance with the present invention.

According to the invention, the organic material has the formula, in particular, as shown in FIG. 6 while satisfying the chemical structure as described above.

The inorganic material of the interface deterioration preventing layer 203 is one selected from a halide or an oxide of 1A, 2A, 3A and 4A-groups of the periodic table. The halide includes LiF, NaF, KF, RbF, CsF, FrF, $MgF_2$, $CaF_2$, NaCl, $CaCl_2$, LiCl, KCl, RbCl, CsCl, FrCl, $MgCl_2$ and the like. The oxide includes $Li_2O$, $Na_2O$, $K_2O$, BeO, MgO, CaO, $B_2O_3$, $Al_2O_3$ and $SiO_2$, and the like.

The interface deterioration preventing layer 203 is formed by mixing the organic and inorganic materials appropriately selected from the materials as described above.

As for a method of forming the interface deterioration preventing layer 203, there are three methods of providing the organic and inorganic materials as follows.

As a first method, the organic material is deposited to a thickness of about 0.5 nm on the anode 202, and the inorganic material is then deposited to a thickness of about 0.1 nm on the organic material in a layer-by-layer manner by a vacuum deposition process. In this method, it should be noted that the thickness of the deposited material is proposed as an example, and that the organic material and the inorganic material may have a thickness in the range of 0.1~10 nm. At this time, the interface deterioration preventing layer 203 has a total thickness of 100 nm or less.

As a second method, the organic and inorganic materials are mixed by co-depositing the organic and inorganic materials. At this time, a mixing ratio of these materials is set as the following relationship.

If organic material:Inorganic material=X:Y, $1 \leq X \leq 100$ and Y=1, or X=1 and $1 \leq Y \leq 100$.

The ratio of the organic material to the inorganic material is selected so as to satisfy the above relationship, and the total thickness of the interface deterioration preventing layer 203 is 100 nm or less.

As a third method, when mixing the organic and inorganic material, the mixing ratio of the organic material and the inorganic material is changed according to a location in the device.

Specifically, When X'=inorganic material/(organic material+inorganic material) and Y'=organic material/(organic material+inorganic material), X' is 1 and Y' is 0 at an interface between the anode 202 and the interface deterioration preventing layer 203, whereas X' is 0 and Y' is 1 at an interface between an bole transport layer 204 and the interface deterioration preventing layer 203. At this time, the values of X' and Y' are linearly changed at both interfaces, respectively. In this method, the total thickness of the interface deterioration preventing layer 203 is 100 nm or less.

As such, the interface deterioration preventing layer 203 is formed by appropriately providing the organic material and the inorganic material as described above, so that thermal stress between the anode and the interface deterioration preventing layer 203 is relieved, and mobility of the holes is reduced, thereby optimizing balance of electric charge between holes and electrons resulting in enhancement of light emitting efficiency of the organic EL device.

Next, an organic EL layer is formed on the interface deterioration preventing layer 203.

The organic EL layer has a multilayer structure in which a hole injection layer 204, a hole transport layer 205, a light emitting layer 206, an electron transport layer (ETL) 207, and an electron injection layer (ETL) 208 are sequentially stacked. In some cases, other layers may be further added thereto or some of the layers may be removed therefrom.

Then, a cathode 209 is formed on the organic EL layer, thereby completing the organic EL device.

For an inventive example, as shown in FIG. 5, the transparent substrate 201 was formed of a glass, the anode 202 was formed of ITO, and the interface deterioration preventing layer 203 was formed of NPD as an organic material and $MgF_2$ as an inorganic material.

As a method for providing the organic and inorganic materials, the second method described above was used for forming the interface deterioration preventing layer 203 such that the organic material was mixed with the inorganic material in the ratio of NPD:$MgF_2$=5:1 in terms of weight ratio, and the interface deterioration preventing layer 203 had a total thickness of about 10 nm.

The hole injection layer (HIL) 204 for hole injection and the hole transport layer (HTL) 205 for hole transmission were formed to a thickness of about 50 nm by depositing NPD (4,4'-bis[N-(1-naphthyl)-N-phenyl-amino]biphenyl) on the interface deterioration preventing layer 203.

Then, the light emitting layer 206 was formed on the HTL 205, and in the case of a green light emitting device, it was formed to a thickness of about 25 nm by doping about 1% coumarin derivative (C545T) to Alq3 (8-hydroxyquinoline aluminum).

The electron transport layer (ETL) 207 was formed to a thickness of about 35 nm by depositing Alq3 (8-hydroxyquinoline aluminum), and the electron injection layer (ETL) 208 was formed to a thickness of about 0.5 nm by depositing LiF. The cathode 209 was formed to a thickness of about 200 nm by depositing Al.

Characteristics of the device of the invention manufactured as described above will be described as follows in comparison to a comparative example.

As for the comparative example, an organic EL device was manufactured, which has the same construction as that of the inventive example shown in FIG. 5, except that the comparative example does not have an interface deterioration preventing layer (IDPD) and has an HIL (or HTL) consisting of NPD.

Figure 7:
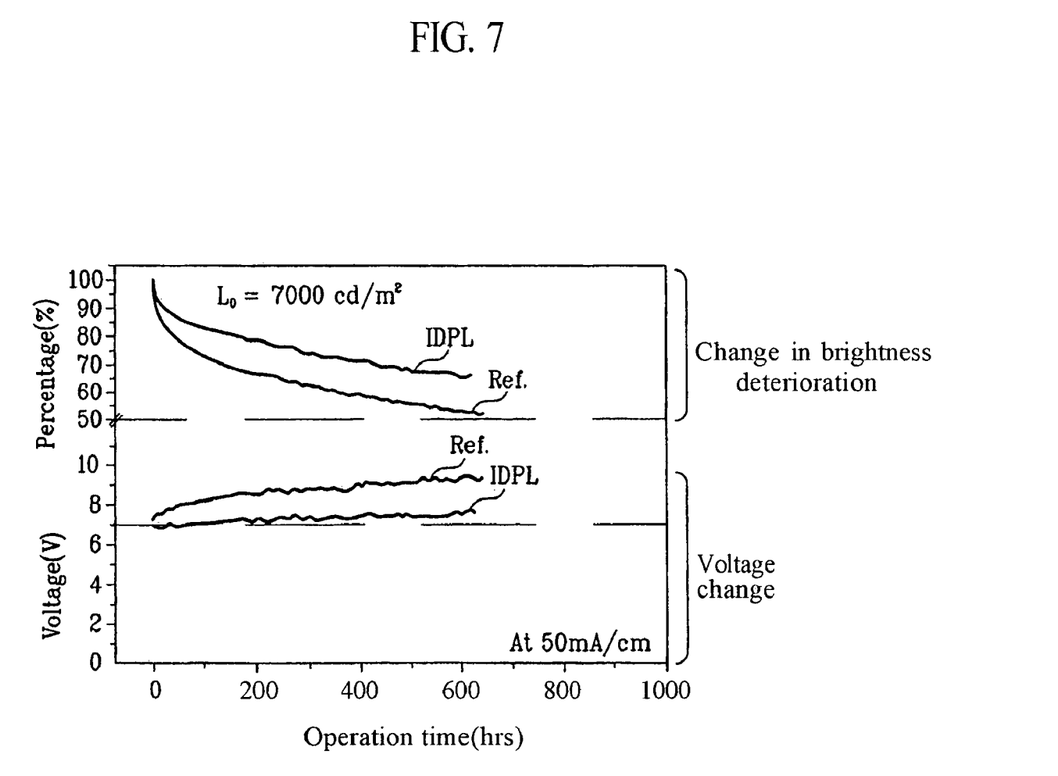
FIG. 7 is a graph depict results of a test of constant current acceleration for the organic EL device in accordance with the present invention.
Figure 8:
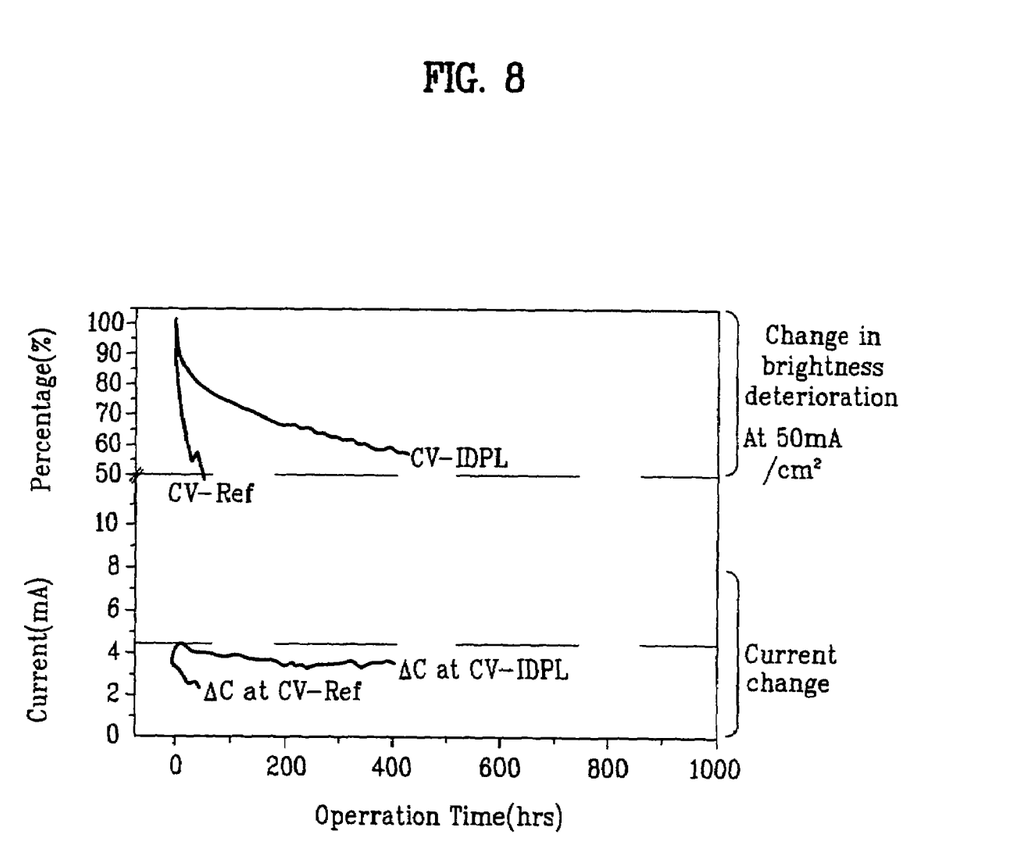
FIG. 8 is a graph depicting results of a test of constant voltage acceleration for the organic EL device in accordance with the present invention.

FIG. 7 is a graph depicting results of a test of constant current acceleration for the organic EL device of the invention, and FIG. 8 is a graph depicting results of a test of constant voltage acceleration for the organic EL device of the invention.

As shown in FIG. 7, the comparative example and the inventive example comprising the IDPD were tested for constant current acceleration at a current density of 50 $mA/cm^2$.

As can be seen from FIG. 7, the device comprising the IDPL is remarkably suppressed in change of voltage during an operation time, and the life span of the device is about twice the life span of the comparative example since the IDPL suppresses interface deterioration.

Additionally, as shown in FIG. 8, it can be seen that, when the device comprising the IDPD is driven by a predetermined voltage, the life span of the device is about ten times the life span of the comparative example.

The following Table 1 shows the light emitting efficiency, the life span, and the voltage variation of the inventive example and the comparative example according to the test of constant current acceleration.

TABLE 1

|  | Inventive example (IDPL) | Comparative example (NPD) |
| --- | --- | --- |
| Efficiency (cd/A) (@5000 nits) | ~15 | ~12 |
| Life span (hrs) (@50 mA/cm2) | >1200 hrs | ~600 hrs |
| ΔV @50 mA/cm2 | <0.2 V | ~2 V |

As apparent from the above description, the organic EL device of the invention has an interface deterioration preventing layer consisting of a mixture of an organic material and an inorganic material inserted between an anode comprising ITO as the organic material, and HIL comprising the inorganic material, so that deterioration and thermal stress of the device is relieved, and so that the device is suppressed in voltage increase upon constant current driving while minimizing current decrease upon constant voltage driving.

Additionally, an amount of holes injected into the organic EL device can be controlled, and a balance of electric charge between the holes and electrons can be optimized by controlling the amount of the inorganic material added to the interface deterioration preventing layer and the thickness of the interface deterioration preventing layer, thereby maximizing light efficiency of the device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent (EL) device, comprising:
    a substrate;
    an anode formed on the substrate;
    an interface deterioration preventing layer formed on the anode, and formed of a mixture of an organic material and an inorganic material;
    a hole injection layer on the interface deterioration preventing layer;

a hole transport layer on the hole injection layer;
a light emitting layer on the hole transport layer;
an electron transport layer on the light emitting layer;
an electron injection layer on the electron transport layer; and
a cathode on the electron injection layer,
wherein the organic material includes an aromatic amine compound having hole transmission properties, and the inorganic material is one selected from a halide or an oxide of 1A, 2A, 3A and 4A-groups of the periodic table.

2. The organic EL device according to claim 1, wherein the aromatic amine compound has a chemical structure of 3. The organic EL device according to claim 2, wherein $Ar_1$ and $Ar_2$ are either substituted or non-substituted aromatic groups, respectively.

4. The organic EL device according to claim 3, wherein $Ar_1$ and $Ar_2$ are ones selected from the group consisting of biphenylylenyl, phenanthrenyl, fluorenyl, terphenylyl and anthracenyl, and, when the substituted aromatic groups are used, a substituent is one selected from methyl, ethyl, propyl, t-buthyl, methoxy, ethoxy, propoxy, dimethylamine, diethylamine, phenyl, fluorine, chlorine, and bromine.

5. The organic EL device according to claim 2, wherein the aromatic amine compound is selected from among the following formulae 6. The organic EL device according to claim 1, wherein the inorganic material is one selected from a halide or an oxide of 1A, 2A, 3A and 4A-groups of the periodic table.

7. The organic EL device according to claim 6, wherein the halide is one selected from LiF, NaF, KF, RbF, CsF, FrF, $MgF_2$, $CaF_2$, NaCl, $CaCl_2$, LiCl, KCl, RbCl, CsCl, FrCl and $MgCl_2$.

8. The organic EL device according to claim 6, wherein the oxide is one selected from $Li_2O$, $Na_2O$, $K_2O$, BeO, MgO, CaO, $B_2O_3$, $Al_2O_3$ and $SiO_2$.

9. The organic EL device according to claim 1, wherein the interface deterioration preventing layer has a thickness of 100 nm or less.

10. The organic EL device according to claim 1, wherein the interface deterioration preventing layer has a structure selected from a structure formed by repetitiously stacking organic and inorganic layers in the sequence of either organic layer/inorganic layer or inorganic layer/organic layer, a structure formed by mixing an organic material and an inorganic material with a predetermined mixing ratio, and a structure formed by stacking the organic and inorganic layers in the sequence of either organic layer/inorganic layer or inorganic layer/organic layer such that a mixing ratio of the organic material and the inorganic material is linearly changed at an interface between the organic layer and the inorganic layer.

11. A method for manufacturing an organic EL device, comprising the steps of:
forming an anode on a substrate;
forming an interface deterioration preventing layer consisting an organic material and an inorganic material on the anode;
forming a hole injection layer on the interface deterioration preventing layer;
forming a hole transport layer on the hole injection layer;
forming a light emitting layer on the hole transport layer;
forming an electron transport layer on the light emitting layer;
forming an electron injection layer on the electron transport layer; and
forming a cathode on the electron injection layer
wherein the organic material includes an aromatic amine compound having hole transmission properties, and the inorganic material is one selected from a halide or an oxide of 1A, 2A, 3A and 4A-groups of the periodic table.

12. The method according to claim 11, wherein the interface deterioration preventing layer is formed by repetitiously stacking organic and inorganic layers in the sequence of either organic layer/inorganic layer or inorganic layer/organic layer.

13. The method according to claim 12, wherein each organic layer and inorganic layer has a thickness of 0.1~10 nm, and the interface deterioration preventing layer has a total thickness of 100 nm or less.

14. The method according to claim 11, wherein the interface deterioration preventing layer is formed by depositing the organic material and the inorganic material at the same time such that the organic material is mixed with the inorganic material.

15. The method according to claim 14, wherein a mixing ratio between the organic material and the inorganic material satisfies the relationship that, when organic material:inorganic material=X:Y $\leq 1 \leq X \leq 100$ and Y=1, or X=1 and $1 \leq Y \leq 100$.

16. The method according to claim 11, wherein the interface deterioration preventing layer is formed by stacking the organic and inorganic layers in the sequence of either organic layer/inorganic layer or inorganic layer/organic layer such that a mixing ratio between the organic material and the inorganic material is linearly changed at an interface between the organic layer and the inorganic layer.

* * * * *